United States Patent
Zhu et al.

(10) Patent No.: US 9,640,438 B2
(45) Date of Patent: May 2, 2017

(54) INTEGRATED CIRCUITS WITH INACTIVE GATES AND METHODS OF MANUFACTURING THE SAME

(71) Applicant: GLOBALFOUNDRIES Singapore Pte. Ltd., Singapore (SG)

(72) Inventors: Ming Zhu, Singapore (SG); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 84 days.

(21) Appl. No.: 14/585,250

(22) Filed: Dec. 30, 2014

(65) Prior Publication Data

US 2016/0190012 A1    Jun. 30, 2016

(51) Int. Cl.

| | |
|---|---|
| *H01L 21/70* | (2006.01) |
| *H01L 21/8234* | (2006.01) |
| *H01L 29/66* | (2006.01) |
| *H01L 21/321* | (2006.01) |
| *H01L 27/088* | (2006.01) |
| *H01L 21/28* | (2006.01) |
| *H01L 29/49* | (2006.01) |
| *H01L 21/8238* | (2006.01) |

(52) U.S. Cl.
CPC ......... *H01L 21/823437* (2013.01); *H01L 21/28088* (2013.01); *H01L 21/32115* (2013.01); *H01L 21/823475* (2013.01); *H01L 27/088* (2013.01); *H01L 29/66545* (2013.01); *H01L 21/823842* (2013.01); *H01L 29/4966* (2013.01)

(58) Field of Classification Search
CPC .......... H01L 29/66545; H01L 29/4966; H01L 29/82345; H01L 21/28088; H01L 21/32115; H01L 21/823437; H01L 21/823475; H01L 27/088; Y10S 438/926
See application file for complete search history.

(56) References Cited

U.S. PATENT DOCUMENTS

| | | | | |
|---|---|---|---|---|
| 6,323,113 | B1* | 11/2001 | Gabriel | H01L 21/76229 257/207 |
| 7,157,289 | B2* | 1/2007 | Morey-Chaisemartin | H01L 21/31053 257/E21.244 |
| 7,902,610 | B2* | 3/2011 | Tai | H01L 21/823842 257/369 |
| 8,513,033 | B2* | 8/2013 | Kawahara | G06F 17/5068 257/E21.244 |
| 2005/0136677 | A1* | 6/2005 | Brask | H01L 21/0337 438/706 |
| 2013/0140641 | A1* | 6/2013 | Chuang | H01L 21/823842 257/369 |

* cited by examiner

*Primary Examiner* — Jesse Y Miyoshi
(74) *Attorney, Agent, or Firm* — Lorenz & Kopz, LLP

(57) ABSTRACT

Integrated circuits and methods for manufacturing the same are provided. A method for producing an integrated circuit includes forming a first active dummy gate, a second active dummy gate, and an inactive gate overlying a substrate. The first active dummy gate is replaced with a first metal gate, where replacing the first active dummy gate includes planarizing the first metal gate, the second active dummy gate, and the inactive gate. The second active dummy gate is replaced with a second replacement metal after the first active dummy gate was replaced, where the inactive gate remains overlying the substrate.

12 Claims, 6 Drawing Sheets

INTEGRATED CIRCUITS WITH INACTIVE GATES AND METHODS OF MANUFACTURING THE SAME

TECHNICAL FIELD

The technical field generally relates to integrated circuits and methods for manufacturing integrated circuits with inactive gates, and more particularly relates to integrated circuits with "N" and "P" field effect transistors having metal gates of about the same height and methods of manufacturing such integrated circuits.

BACKGROUND

The majority of present day integrated circuits are implemented by using a plurality of interconnected field effect transistors (FETs), also called metal oxide semiconductor field effect transistors (MOSFETs or MOS transistors). A FET includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions. The FETs are generally "N" or "P" type FETs, ("nFET" or "pFET") where the source and drain for nFETs are implanted with "N" type conductivity-determining ions, and the source and drain for pFETs are implanted with "P" type conductivity determining ions.

The gate electrode may be a replacement metal gate, or simply a metal gate. A sacrificial gate, which is called a "dummy" gate, is initially formed while other components of the integrated circuit are manufactured. The "dummy" gates for the pFETs are typically removed and replaced with a replacement metal gate first, and then the "dummy" gates for the nFET are removed and replaced with the replacement metal gate. However, the "dummy" gates can be replaced in the opposite order, where the nFET is replaced first. Overburden from the formation of the metal gates is removed by chemical mechanical planarization, (referred to herein as "planarization.") Therefore, the metal gate formed first is planarized twice; once after the formation of each type of metal gate. The planarization process reduces the gate height, and the amount of gate height reduction is variable. The reduction in gate height increases the electrical resistance in the gate and changes a threshold voltage for the FET in a variable and unpredictable manner. Electric circuit models may not be accurate when the gate resistance or the threshold voltage for a transistor are not within a specified range, so the reliability of the integrated circuit can be reduced.

Accordingly, it is desirable to provide integrated circuits and methods of manufacturing integrated circuits with more consistent metal gate heights. In addition, it is desirable to provide integrated circuits and methods of forming them with higher metal gate heights, especially for the metal gates formed first. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for manufacturing the same are provided. In an exemplary embodiment, a method for manufacturing an integrated circuit includes forming a first active dummy gate, a second active dummy gate, and an inactive gate overlying a substrate. The first active dummy gate is replaced with a first metal gate, where replacing the first active dummy gate includes planarizing the first metal gate, the second active dummy gate, and the inactive gate. The second active dummy gate is replaced with a second replacement metal after the first active dummy gate is replaced, where the inactive gate remains overlying the substrate after replacing the second active dummy gate.

A method for manufacturing an integrated circuit is provided in another embodiment. A first active dummy gate, a second active dummy gate, and an inactive gate are formed overlying a substrate. The first active dummy gate is replaced with a first metal gate. The second active dummy gate is replaced with a second metal gate after replacing the first active dummy gate, where the inactive gate remains overlying the substrate. An inactive gate area is about 0.1 percent or more of a tile area.

An integrated circuit is provided in yet another embodiment. A first metal gate overlies a substrate, where the first metal gate includes a first conductive core. A second metal gate overlies the substrate, where the second metal gate includes a second conductive core. An inactive gate overlies the substrate, where the inactive gate includes polysilicon. The inactive gate is within about 70 microns of the first metal gate. An interlayer dielectric overlies the substrate.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

According to various embodiments described herein, a first active dummy gate, a second active dummy gate, and an inactive gate are formed overlying a substrate, where the active dummy gates are destined to be replaced with metal gates that will be part of an electronic component that conducts electricity and the inactive gates are destined to remain as inactive components that do not conduct electricity. The first active dummy gate may be used to form one of an nFET or a pFET through replacement metal gate techniques, and the second active dummy gate is used to form the other of the nFET or pFET. The inactive gate is not incorporated as an electrical component in the integrated circuit. The first active dummy gate is replaced with a first metal gate, and then the second active dummy gate is replaced with a second metal gate. The inactive gate remains as an inactive gate, and is not replaced with a metal gate. The inactive gate is formed from a material that resists wear during planarization to inhibit wear on the first and/or second metal gates in close proximity. Inactive gates may be formed in close proximity to the first active dummy gate to protect the first metal gate from excessive wear during planarization, and may be placed near the second inactive dummy gate in some embodiments. The first metal gate is planarized twice, as described above, so excessive wear of the first metal gate is a greater concern than excessive wear of the second metal gate.

Figure 1:
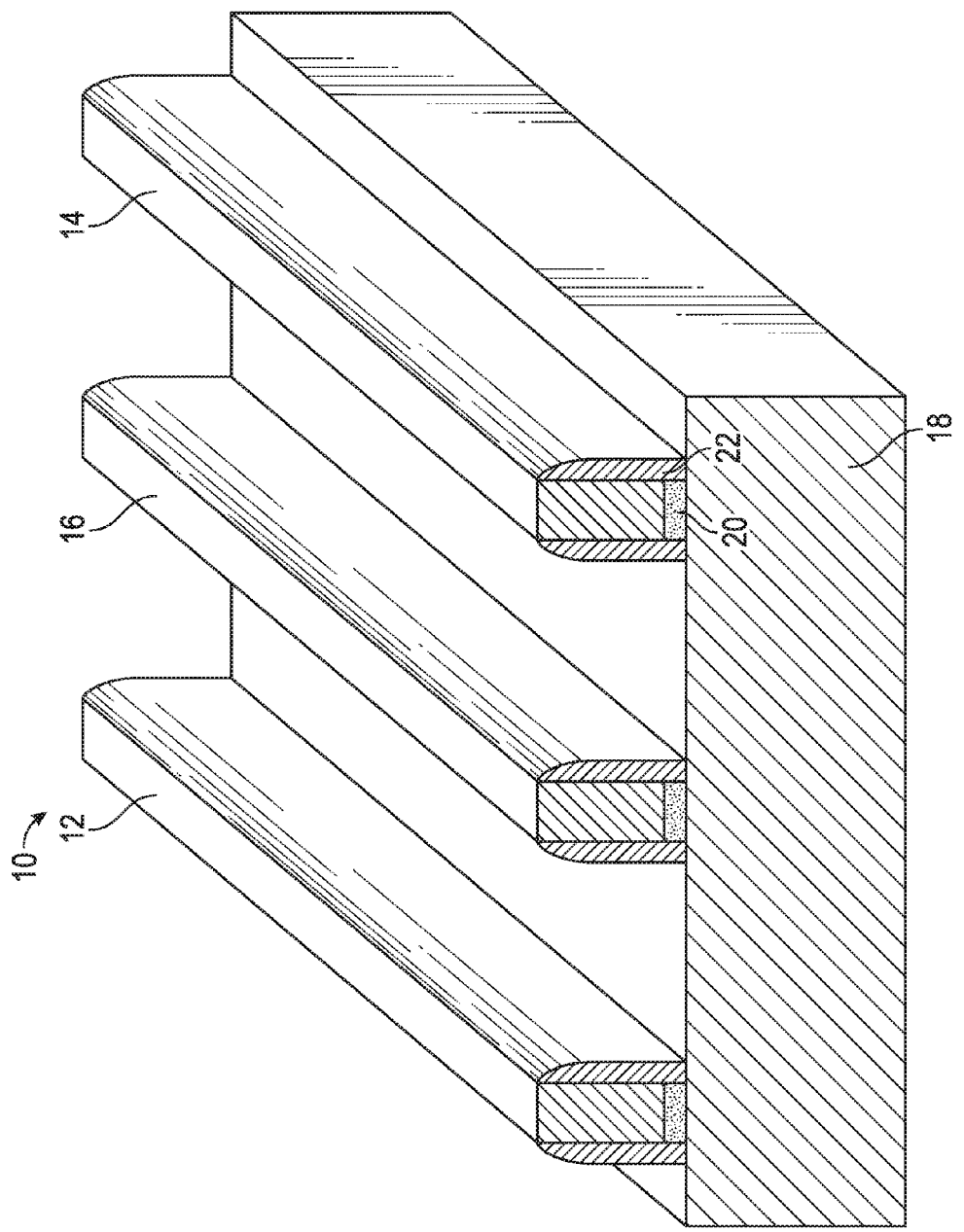
FIG. 1 is a sectioned perspective view of an exemplary embodiment of a portion of an integrated circuit.

An exemplary embodiment of an integrated circuit 10 is illustrated in FIG. 1. The integrated circuit 10 includes a first active dummy gate 12, a second active dummy gate 14, and an inactive gate 16 formed overlying a substrate 18. As used herein, the term "substrate" 18 will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the substrate 18 is a monocrystalline silicon material. The silicon substrate 18 may be a bulk silicon wafer (as illustrated) or may be a thin layer of silicon on an insulating layer (commonly known as silicon-on-insulator or SOI) that, in turn, is supported by a carrier wafer.

In an exemplary embodiment, the first and second active dummy gates 12, 14 and the inactive gate 16 include polysilicon formed overlying a gate dielectric 20, where the gate dielectric 20 overlies the substrate 18. As used herein, the term "overlying" means "over" such that an intervening layer may lie between the first and second active dummy gates 12, 14 and the gate dielectric 20, and "on" such the first and second active dummy gates 12, 14 physically contacts the gate dielectric 20. The gate dielectric 20 may include one or more layers of a dielectric material with a high dielectric constant, such as hafnium oxide ($HfO_2$) or hafnium silicon oxynitride (HfSiON). A "high" dielectric constant is about 3.7 or more in some embodiments, but other types of dielectric materials can be used in the gate dielectric 20 in alternate embodiments. A titanium nitride (TiN) cap (not illustrated) may optionally be positioned between the high dielectric constant material and the first and second dummy gates 12, 14 where the cap is part of the gate dielectric 20. The height of the first and second active dummy gates 12, 14 and the inactive gate 16 are measured from the gate dielectric 20, and are from about 20 nanometers to about 100 nanometers in some embodiments, or from about 20 nanometers to about 50 nanometers in other embodiments, but other thicknesses are also possible. Spacers 22 are positioned on opposite sides of the first and second active dummy gates 12, 14 and the inactive gate 16, where the spacers 22 also overlie the substrate 14. The spacers 22 may include silicon nitride in an exemplary embodiment. A source and a drain (not illustrated) may be formed in the substrate 18 self-aligned to the spacers 22 on opposite sides of the first and second active dummy gates 12, 14, where the source and drain are implanted with "N" type conductivity-determining ions or "P" type conductivity-determining ions for an nFET or a pFET, respectively. "N" type conductivity-determining ions primarily include ions of phosphorous, arsenic, and/or antimony, but other materials could also be used. "P" type conductivity-determining ions primarily include boron, aluminum, gallium, and indium, but other materials could also be used.

Embodiments of the present disclosure are generally directed to integrated circuits 10 and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 2:
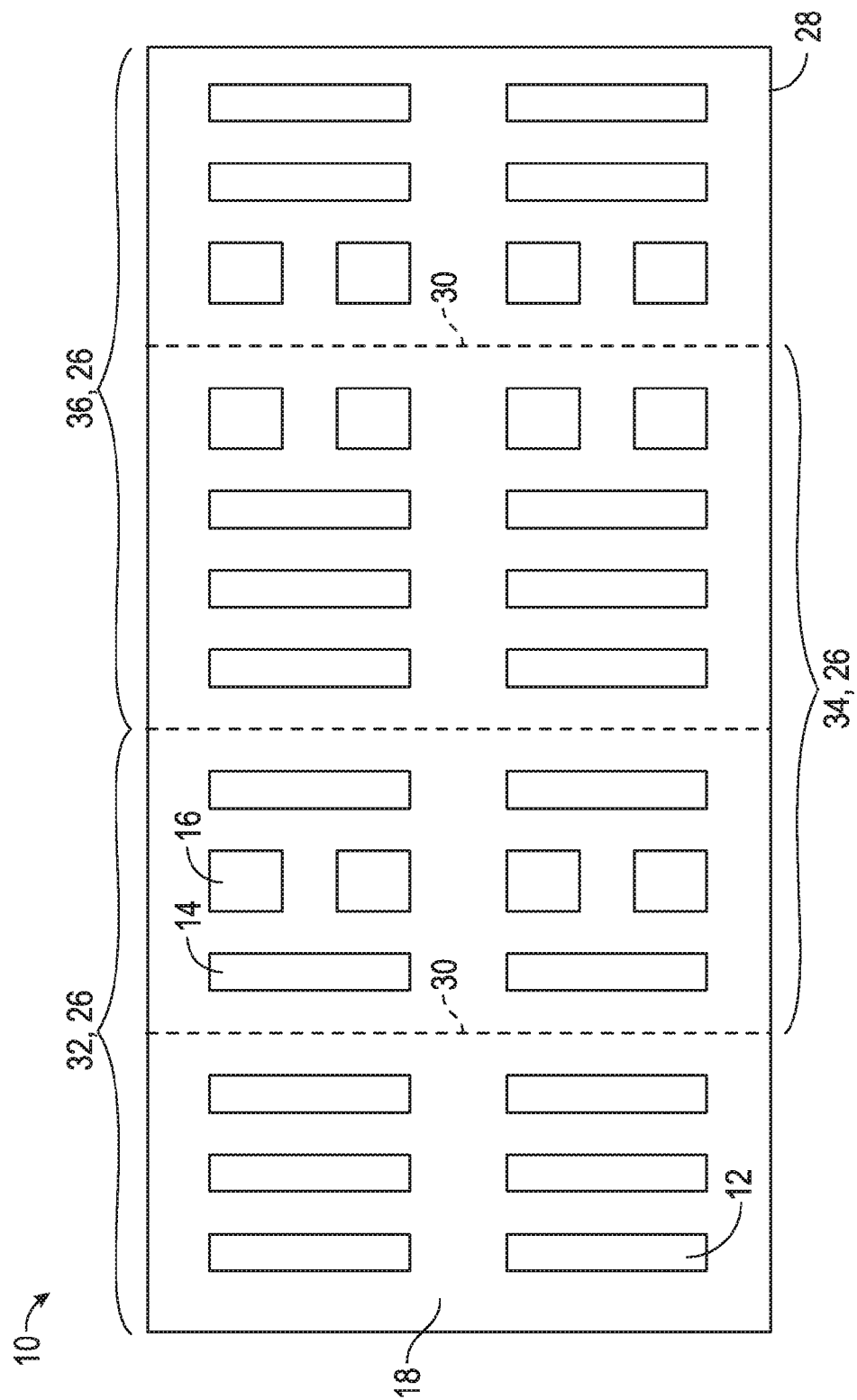
FIG. 2 is a plan view of a portion of the integrated circuit.

Reference is made to FIG. 2, with continuing reference to FIG. 1, where FIG. 2 is a plan view of a portion of an integrated circuit 10. The first and second active dummy gates 12, 14 are "dummy" gates that will eventually be replaced with a metal gate (described more fully below) and incorporated into an integrated circuit 10. The inactive gate 16 is formed, but will not be an electrically functioning component of an electronic circuit. The first and second active dummy gates 12, 14 and the inactive gate 16 may be formed in certain locations within an integrated circuit. For example, the first and second active dummy gates 12, 14 and the inactive gate 16 may be part of a memory array, and the FETs will be used to store data, but the first and second active dummy gates 12, 14 and the inactive gate 16 may be in other portions of an integrated circuit in alternate embodiments. The inactive gate 16 may be specified by manufacturers, integrated circuit customers, or a combination thereof in various embodiments.

The integrated circuit 10 may include a plurality of tile areas 26, where a tile area 26 has a length line 28 and a width line 30, so the area of the tile area 26 is the product of the length line 28 and the width line 30. In an exemplary embodiment, the tile area 26 is a 50 micron tile area 26 with a 50 micron length line 28 and a 50 micron width line 30, so the 50 micron tile area 26 has an area of about 2,500 square microns. The tile areas 26 are designated to encompass the first and second active dummy gates 12, 14, so certain areas of the integrated circuit 10 that do not include a first or second active dummy gate 12, 14 may not be designated as a tile area 26. The plurality of tile areas 26 may be sectioned within the integrated circuit 10 at a 50 percent step, so a second tile area 34 overlaps a first tile area 32 by about 50 percent, and a third tile area 36 overlaps the second tile area 34 by about 50 percent. As an example and in reference to the 50 micron tile area 26, the width line 30 of the first tile area 32 is about twenty five microns from the corresponding width line 30 of the second tile area 34, and the width line 30 of the third tile area 36 is about twenty five microns from the corresponding width line 30 of the second tile area 34. As such, each fifty micron tile area 26 overlaps the next fifty micron tile area 26 by about 50 percent. In alternate embodiments, the tile area 26 may be established with different dimensions, and the step may be different as well.

A total gate area is the area of the top surface of all the gates in a region, such as all the first active dummy gates 12, the second active dummy gates 14, and the inactive gates 16 within a tile area 26. The total gate area may be calculated before or after the initial "dummy" gates are replaced with metal gates, as described more fully below. In an exemplary embodiment, the total gate area within a tile area 26 is about 60 to about 65 percent of the area of the tile area 26, and the area of the top surface of the inactive gates 16 that are maintained as inactive gates (as described more fully below, referred to herein as the inactive gate area) is from about 0.1 to about 3 percent of the area of the tile area 26. If the total gate area is from more than about 65 to about 70 percent of the area of the tile area 26, the inactive gate area may be increased to from about 3 to about 6 percent of the area of the tile area 26. In some embodiments, the total gate area is limited to no more than about 70 percent of the area of the tile area 26. A certain portion of the inactive gates 16 within a tile area 26 are maintained as inactive gates 16 (instead of being replaced with metal gates, as described below) such that the desired inactive gate area is produced within each tile area 26. Each tile area 26 includes an inactive gate 16 that is maintained as an inactive gate, so in an embodiment with a 50 micron tile area 26 the inactive gate 16 is within about 70 microns of the first active dummy gate 12 because 70 microns is about the maximum distance across a fifty micron tile area 26 (from opposite corners, i.e. the diagonal of the tile area 26). In an embodiment with a 50 micron tile area 26 the inactive gate 16 is also within about 70 microns from the second active dummy gate 14 for the same reason. As such, each first and second active dummy gate 12, 14 is relatively close to the inactive gate 16 (within about 70 microns or closer in an embodiment with a 50 micron tile area 26).

Figure 3:
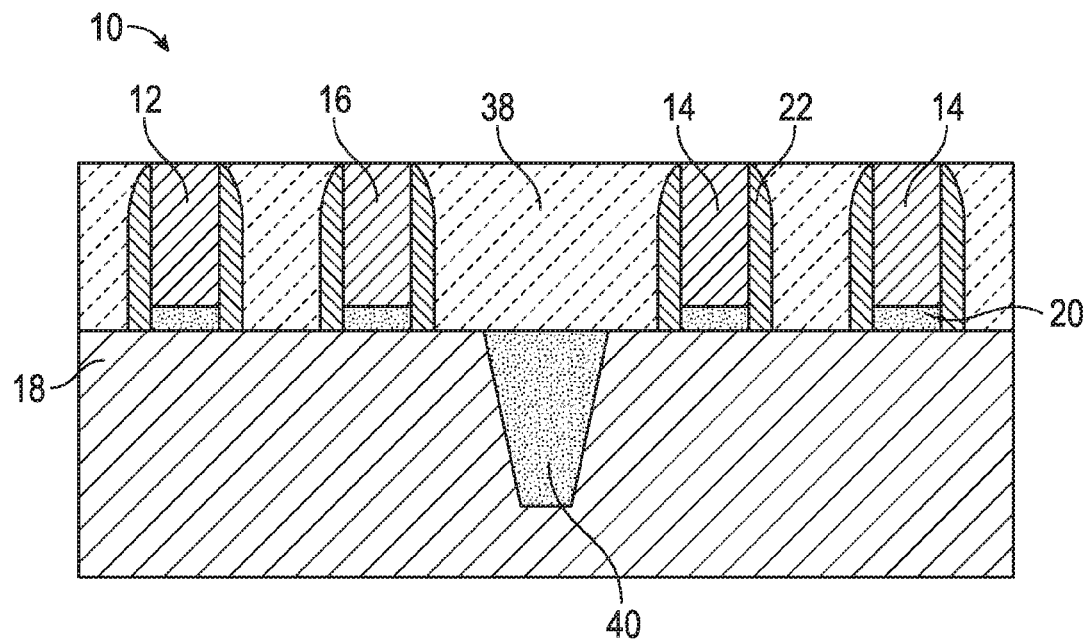
FIGS. 3-10 are side sectioned views illustrating portions of an integrated circuit and methods for its fabrication in accordance with exemplary embodiments.

Referring to FIG. 3, a dielectric layer 38 is formed overlying the substrate 18, the first and second active dummy gates 12, 14, and the inactive gate 16, where the dielectric layer 38 may include one or more layers of a wide variety of insulating materials. In an exemplary embodiment, the dielectric layer 38 includes silicon dioxide formed by a high density plasma using silane and oxygen, but other raw materials, deposition techniques, or other insulating materials are also possible in alternate embodiments. A portion of the dielectric layer 38 is then removed to expose a top surface of the first and second active dummy gates 12, 14 and the inactive gate 16, as illustrated. Chemical mechanical planarization can be used to remove the top portion of the dielectric layer 38. As such, the dielectric layer 38 is adjacent to the first and second active dummy gates 12, 14 and the inactive gate 16, and is positioned between adjacent gates that overlie the substrate 18.

In an exemplary embodiment, a shallow trench isolation 40 extends into the substrate 18 between the first active dummy gate 12 and the second active dummy gate 14 to electrically isolate the first and second active dummy gates 12, 14. In an exemplary embodiment, the shallow trench isolation 40 includes an insulating material such as silicon dioxide. The shallow trench isolation 40 may be formed before the first and second active dummy gates 12, 14 using methods and techniques well known to those skilled in the art, and the manner of formation or the presence of the shallow trench isolation 40 are not critical to the current embodiment.

Figure 4:
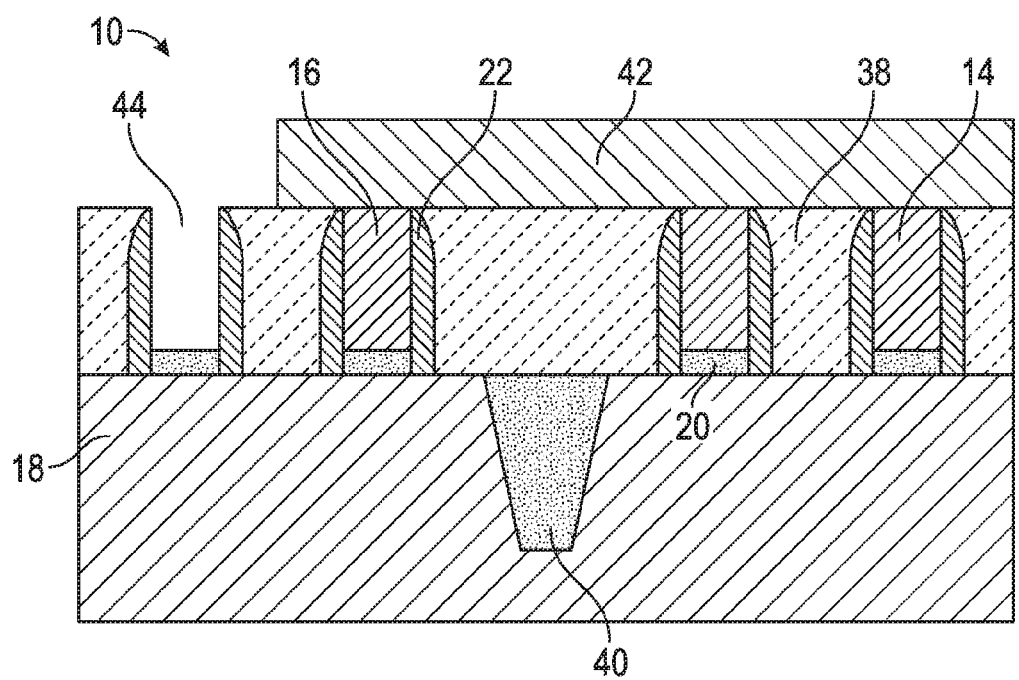

A first mask 42 is formed overlying the second active dummy gate 14 and the inactive gate 16, as illustrated in an exemplary embodiment in FIG. 4 with continuing reference to FIG. 3. The first mask 42 is not positioned overlying the first active dummy gate 12, so the top surface of the first active dummy gate 12 is exposed. The first mask 42 is a photoresist layer in an exemplary embodiment, but the first mask 42 may include a hard mask (not illustrated) or other components in alternate embodiments. The photoresist layer is patterned and developed using known methods and techniques. In an exemplary embodiment, the first active dummy gate 12 and the inactive gate 16 are within an area for pFETs and the second active dummy gate 14 is in an area for nFETs, but in alternate embodiments the gates are opposite.

The first active dummy gate 12 is removed to form a first gate void 44. An etchant selective to the material of the first active dummy gate 12 is used. For example, in embodiments with a polysilicon first active dummy gate 12 a liquid ammonia etchant with hydroxyl compounds can be used. A wide variety of materials can be used to provide hydroxyl compounds to the etchant, such as potassium hydroxide. The titanium nitride cap on the top of the gate dielectric 20 that was mentioned above (not illustrated) may protect the gate dielectric 20 from the liquid etchant in some embodiments. After the first active dummy gate 12 is removed to form the first gate void 44, the first mask 42 is removed, such as with an oxygen containing plasma in embodiments where the first mask 42 is photoresist.

Figure 5:
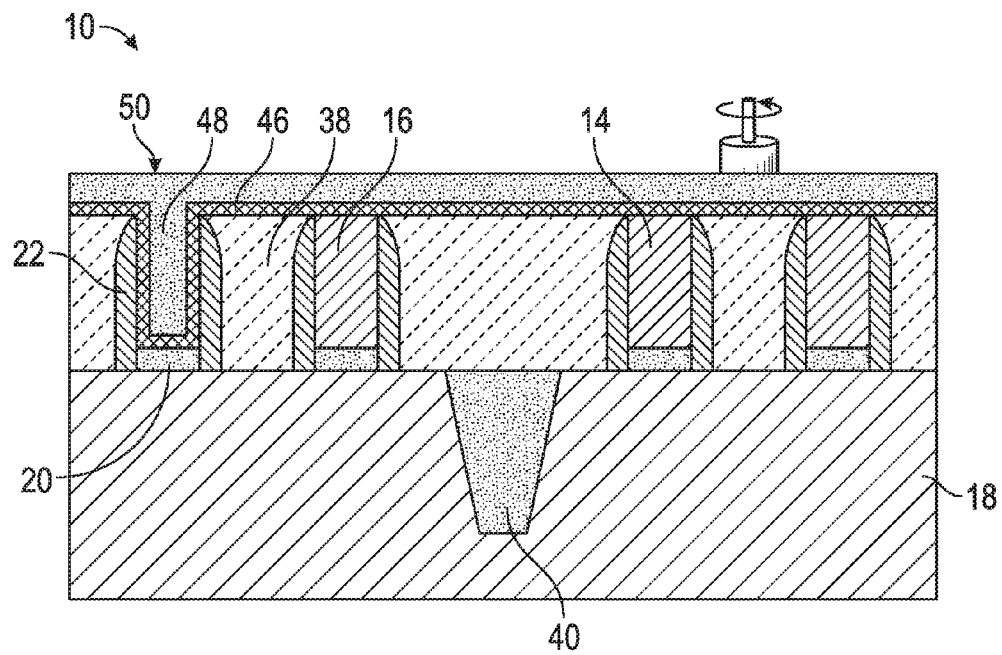

Referring to the exemplary embodiment in FIG. 5, with continuing reference to FIGS. 3 and 4, a first work function layer 46 and a first conductive core 48 are formed. The first work function layer 46 is deposited within the first gate void 44 and overlying the dielectric layer 38, the inactive gate 16, and the second active dummy gate 14. The first work-function determining material is generally a high work function material that is desirable for the gate electrode in PFETs, but is undesirable in NFETs. For example, the first work-function layer 46 may be formed of several layers of different materials, such as tantalum nitride, then titanium nitride, and then another layer of tantalum nitride. The titanium nitride layer may be alloyed with a tuning material in embodiments where the first work function layer 46 will be used for an nFET, such as from about 1 weight percent to about 70 weight percent tuning metal. A variety of tuning metals can be used, including but not limited to aluminum. The first work function layer 46 may include about 0 to about 0.1 weight percent of a tuning material where the first work function layer 46 will be used for a pFET. Other work function designs can be used in alternate embodiments. The first work function layer 46 can be deposited using various methods, such as chemical vapor deposition or atomic layer deposition. A first conductive core 48 is then formed overlying the first work function layer 46, where the first conductive core 48 can be formed from many different conductive components in various embodiments. A conductive material generally has a resistivity of about $1 \times 10^{-4}$ ohm meters or less, and an insulating material generally has a resistivity of about $1 \times 10^4$ ohm meters or more. For example, aluminum may be deposited by chemical vapor deposition using triisobutylaluminium, but in alternate embodiments the first conductive core 48 includes copper, titanium, or other materials that are electrically conductive. The material deposited for the first conductive core 48 overlies the first work function layer 46, and is formed within the first gate void 44 and overlying the dielectric layer 38 and other components. The first work function layer 46 and the first conductive core 48 within the first gate void 44 form a first metal gate 50.

Figure 6:
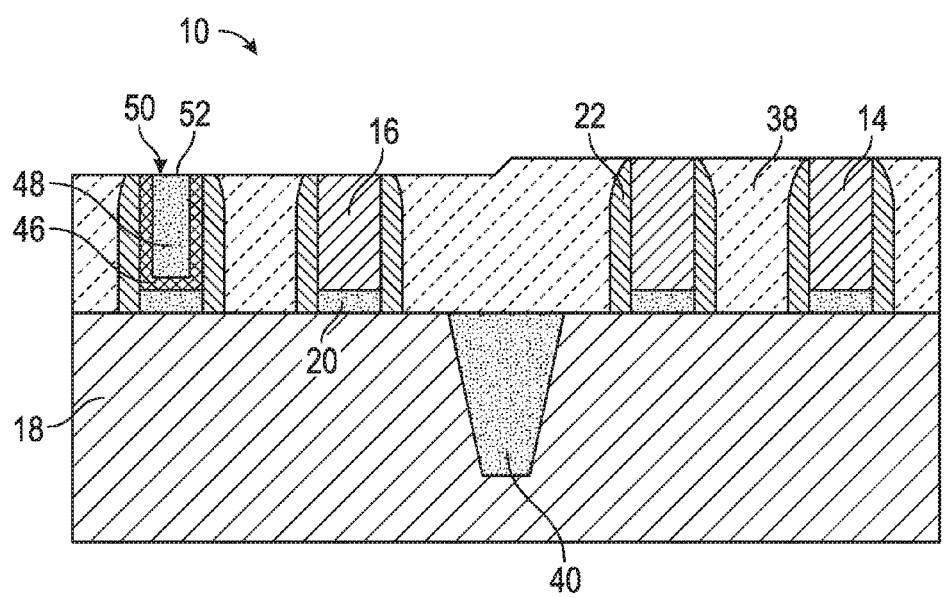

The overburden from the first work function layer 46 and the first conductive core 48 is removed, such as by chemical mechanical planarization (also referred to as planarization). A slurry is used during the planarization, and the slurry facilitates removal of the overburden. Polysilicon is removed more slowly than the material of the first metal gate 50 or the dielectric layer 38, so the amount of material removed from areas with polysilicon gates is less than that for areas without polysilicon gates. As such, a first metal gate top surface 52 is lowered during the planarization process. However, the relatively close proximity of the polysilicon in the inactive gate 16 serves to reduce the amount of material removed from the first metal gate 50 during planarization. The polysilicon of the inactive gate 16 is within about 70 microns of the first metal gate 50, as described above, and the quantity of inactive gates 16 that remain as polysilicon is adjusted to provide adequate protection for the first metal gate 50, as described above with reference to FIG. 2. FIG. 6 illustrates the integrated circuit 10 after planarization of the first metal gate 50, where the first metal gate top surface 52 is lower than a top surface of the second active dummy gate 14. The top surface of the inactive gate 16 is about the same height as the first metal gate top surface 52 because of the close proximity and planarization process, so the top surface of the inactive gate 16 is lower than the top surface of the first inactive gate 14 after planarization of the first metal gate 50.

Figure 7:
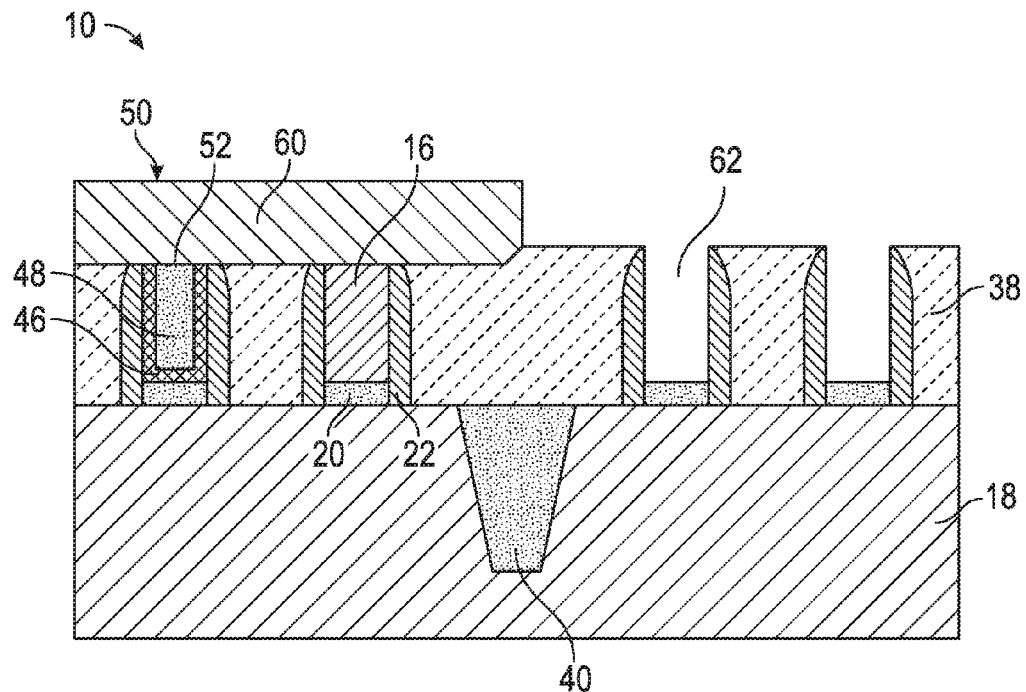
Figure 8:
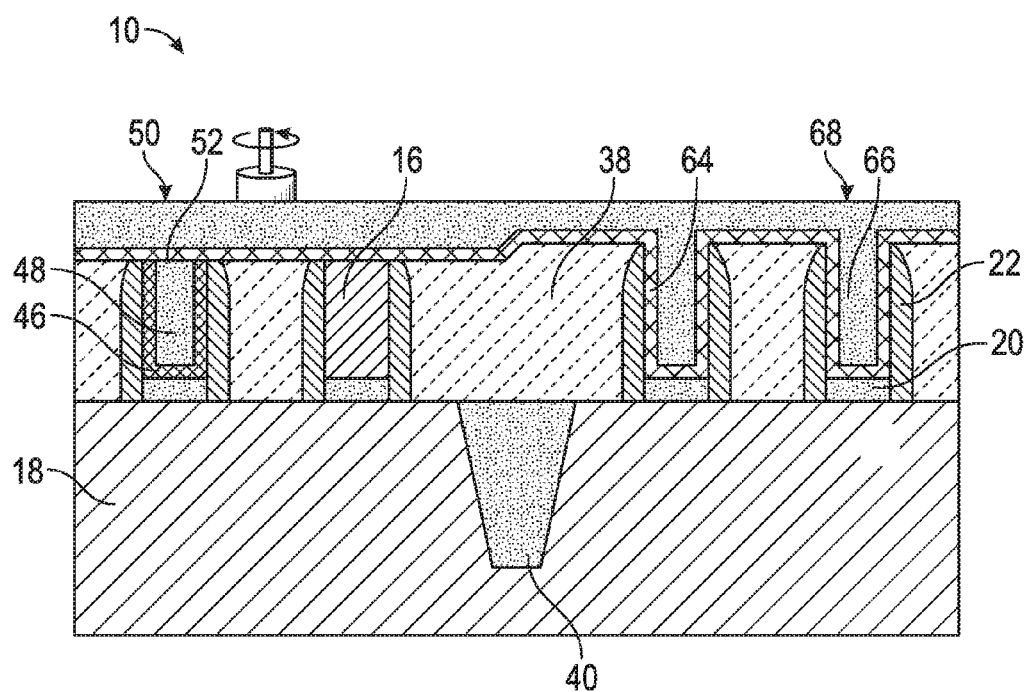

Reference is made to FIG. 7, with continued reference to FIG. 6. FIG. 7 illustrates an exemplary embodiment where a second mask 60 is formed overlying the first metal gate 50 and the inactive gate 16, but exposing the top surface of the second active dummy gate 14. The second mask 60 may be formed of photoresist and it can be patterned to cover the desired components, similar to the first mask 42 described above. The second active dummy gate 14 is then removed with an etchant selective to the material of the second active dummy gate 14 to form a second gate void 62, similar to the etchant for the first active dummy gate described above. Once the second active dummy gate 14 is removed, the second mask 60 can be removed, as described above for the first mask 42. A second work function layer 64 and a second conductive core 66 are then formed in the second gate void 62, with overburden from the second work function layer 64 and the second conductive core 66 extending over the dielectric layer 38, the first metal gate 50, and the inactive gate 16. The second work function layer 64 and the second conductive core 66 in the second gate void 62 form the second metal gate 68. The overburden is removed by planarization, as described above. In this manner, the first and second active dummy gates 12, 14 are replaced with first and second metal gates 50, 68, respectively. The planarization step removes material from the first and second metal gates 50, 68. The first metal gate 50 is planarized twice, but the second metal gate 68 is only planarized once. The inactive gate 16 in relatively close proximity to the first metal gate 50 limits the amount of material removed from the first metal gate 50, which produces a taller first metal gate 50 than if the inactive gate 16 were not present.

Figure 9:
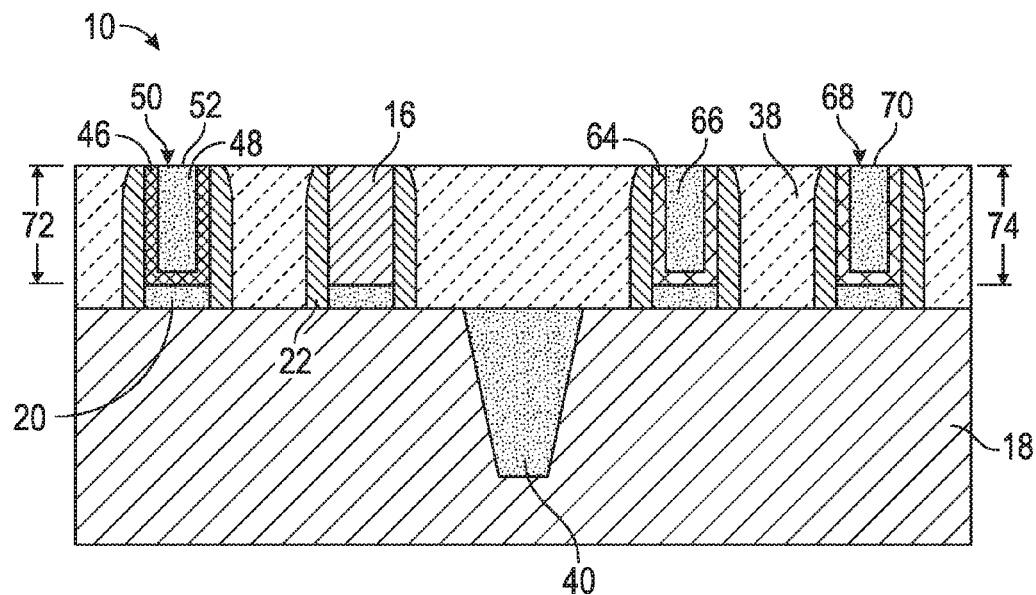

A limited amount of material is removed from the first metal gate 50 during both planarization processes because of the inactive gate 16, and a limited amount of material is removed from the second metal gate 68 because it is only planarized once, as illustrated in an exemplary embodiment in FIG. 9. As such, a first metal gate height, indicated by the double headed arrow 72, is about the same as a second metal gate height, indicated by the double headed arrow 74, where the first and second metal gate heights 72, 74 are measured from the gate dielectric 20 to the first metal gate top surface 52 and a second metal gate top surface 70, respectively. In an exemplary embodiment, the first metal gate height 72 is within about 10 percent of the second metal gate height 72, and the second metal gate height 72 is within about 10 percent of the first metal gate height 70. The difference in the first and second metal gate heights 72, 74 is divided by the first or second metal gate height 72, 74 to determine the percent difference. In alternate embodiments, the first metal gate height 70 is within about 5 percent of the second metal gate height 72, or within about 2 percent of the second metal gate height 72. In a similar manner, the second metal gate height 72 is within about 5 percent or about 2 percent of the first metal gate height 70 in different embodiments. The first metal gate 50 is used to form a pFET and the second metal gate 68 is used to form an nFET in an exemplary embodiment, but the opposite is true in an alternate embodiment.

Figure 10:
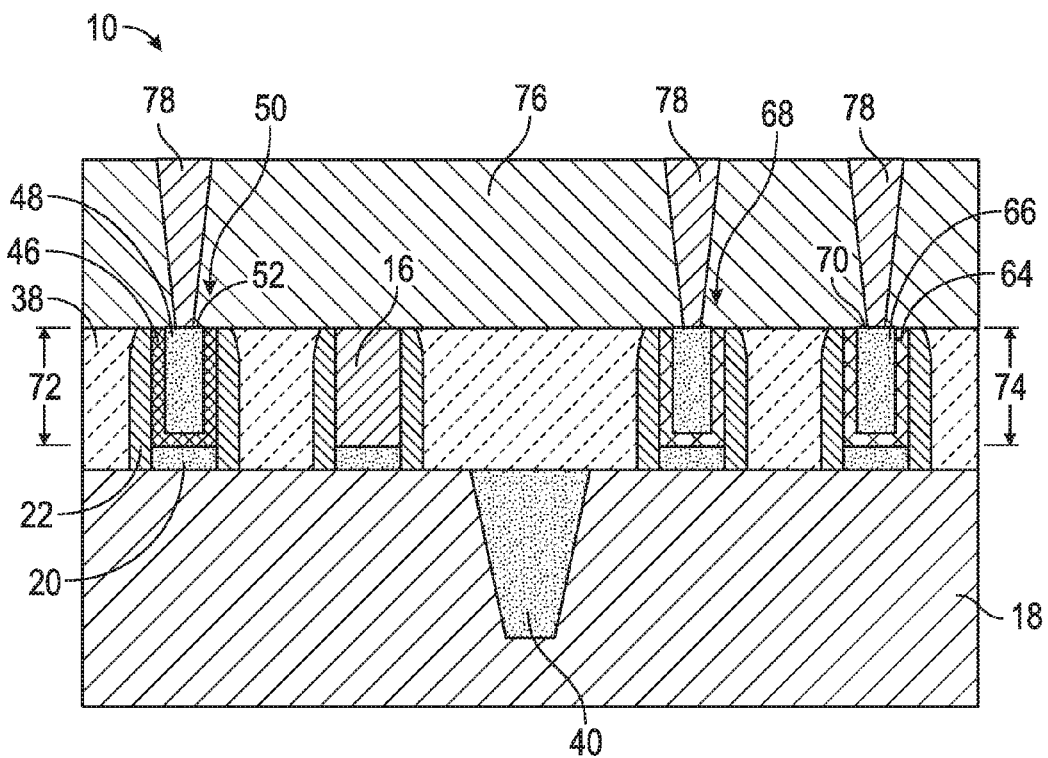

Referring to an exemplary embodiment illustrated in FIG. 10, an interlayer dielectric 76 is formed overlying the substrate 18, the dielectric layer 38, the first and second metal gates 50, 68, and the inactive gate 16. The interlayer dielectric 76 may be formed by depositing silicon dioxide, such as by chemical vapor deposition using silane and oxygen, but other electrically non-conductive materials can also be used. Contacts 78 are then formed through the interlayer dielectric 76 and make an electrical connection with the first and second metal gates 50, 68. The contacts 78 are formed using methods and techniques well known to those skilled in the art, and the manner of manufacture is not critical to this embodiment. The various components described above are then incorporated into the integrated circuit 10 using methods and techniques known to those skilled in the art.

In an exemplary embodiment as described above, the inactive gate 16 provides a polysilicon "plug" that protects nearby metal gates from excessive wear during planarization. This results in the first metal gate 50 having a taller first metal gate height 72 than if the polysilicon inactive gate 16 were not present. The taller first metal gate 50 reduces resistance, and increases the threshold voltage for a FET using the first metal gate 50. An inactive gate 16 of polysilicon can optionally be used for the second metal gate 68 as well as for the first metal gate 50 as described above, but the polysilicon inactive gate 16 is not as important for the second metal gate 68 because it is only planarized once. In some embodiments, the integrated circuit 10 includes a plurality of inactive gates 16, and only some of the inactive gates 16 are maintained as polysilicon inactive gates 16, as mentioned above. The remaining inactive gates 16 are replaced with a metal gate when the first or second active dummy gates 12, 14 are replaced with the first or second metal gates 50, 68, respectively. The inactive gate area referenced above refers to the area of the top surface of the inactive gates 16 that are maintained as the original material of manufacture, and does not include the area of the top surface of any inactive gates 16 that are later replaced with a metal gate. No contacts 78 are needed for the inactive gate 16 for embodiments where the inactive gate 16 remains as polysilicon or where the inactive gate 16 is replaced with a metal gate.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of manufacturing an integrated circuit comprising:

forming a first active dummy gate, a second active dummy gate, and an inactive gate overlying a substrate;

replacing the first active dummy gate with a first metal gate, wherein replacing the first active dummy gate comprises planarizing the first metal gate, the second active dummy gate, and the inactive gate such that a first metal gate top surface is lower than a top surface of the second active dummy gate; and replacing the second active dummy gate with a second metal gate after replacing the first active dummy gate, wherein the inactive gate remains overlying the substrate after replacing the second active dummy gate.

2. The method of claim 1 wherein forming the first active dummy gate, the second active dummy gate, and the inactive gate comprises forming the first active dummy gate, the second active dummy gate, and the inactive gate comprising polysilicon.

3. The method of claim 1 wherein replacing the second active dummy gate comprises maintaining the inactive gate comprising polysilicon as the inactive gate having an inactive gate area, wherein the inactive gate area is about 0.1 percent or more of a tile area.

4. The method of claim 1 further comprising:
sectioning the integrated circuit into a tile area; and
wherein replacing the second active dummy gate with the second metal gate comprises maintaining the inactive gate comprising polysilicon with an inactive gate area, and wherein the inactive gate area is from about 3 to about 6 percent of the tile area when a total gate area is more than about 65 percent to about 70 percent of the tile area.

5. The method of claim 4 wherein sectioning the integrated circuit into the tile area comprises sectioning the integrated circuit into a plurality of tile areas, wherein the plurality of tile areas are formed with a 50 percent step, such that a second tile area overlaps a first tile area by about 50 percent.

6. The method of claim 1 wherein replacing the second active dummy gate with the second metal gate comprises forming the second metal gate with a second metal gate height that is within about 10 percent of a first metal gate height.

7. The method of claim 1 further comprising:
forming a dielectric layer overlying the substrate, wherein the dielectric layer is adjacent to the first active dummy gate and the second active dummy gate.

8. The method of claim 1 further comprising:
maintaining the inactive gate comprising polysilicon when replacing the second active dummy gate.

9. The method of claim 1 further comprising:
forming a gate dielectric between each of the first active dummy gate and the substrate, the second active dummy gate and the substrate, and the inactive gate and the substrate.

10. The method of claim 1 further comprising:
forming a pFET with the first metal gate.

11. The method of claim 1 wherein forming the inactive gate comprises forming the inactive gate within about 70 microns of the first active dummy gate.

12. The method of claim 1 further comprising:
forming an interlayer dielectric overlying the first metal gate, the second metal gate, and the inactive gate; and
forming a contact through the interlayer dielectric, wherein the contact is in electrical connection with the first metal gate.

* * * * *